United States Patent [19]

Hopfer

[11] 4,009,456

[45] * Feb. 22, 1977

[54] VARIABLE MICROWAVE ATTENUATOR

[75] Inventor: Samuel Hopfer, Brooklyn, N.Y.

[73] Assignee: General Microwave Corporation, Farmingdale, N.Y.

[ * ] Notice: The portion of the term of this patent subsequent to Jan. 23, 1990, has been disclaimed.

[22] Filed: Jan. 15, 1973

[21] Appl. No.: 323,856

Related U.S. Application Data

[63] Continuation-in-part of Ser. No. 78,891, Oct. 7, 1970, Pat. No. 3,713,037, which is a continuation-in-part of Ser. No. 788,254, Dec. 31, 1968, abandoned.

[52] U.S. Cl. .......................... 333/81 A; 333/97 R
[51] Int. Cl.² ........................................ H01P 1/22
[58] Field of Search ............... 333/70, 81 R, 81 A, 333/97 R, 84 M; 317/234 W; 307/237

[56] References Cited

UNITED STATES PATENTS

| | | | |
|---|---|---|---|
| 3,105,922 | 10/1963 | Fukui et al. | 317/234 W |
| 3,453,564 | 7/1969 | Russell | 333/81 R |
| 3,487,272 | 12/1969 | Siebertz et al. | 317/234 W |
| 3,597,706 | 8/1971 | Kibler | 333/7 D |
| 3,713,037 | 1/1973 | Hopfer | 333/81 A |

Primary Examiner—Paul L. Gensler
Attorney, Agent, or Firm—Morton C. Jacobs

[57] ABSTRACT

A broadband microwave attenuator is formed by connecting a plurality of PIN diodes in a modified Tee network. Four semiconductor chips of PIN diode material are arranged in a flat layer sandwiched between conductors to form a strip-line configuration of a TEM transmission line, whereby the diodes are part of the line. This strip-line construction is used with outer diodes connected in series circuit relation between input and output terminals, and inner diodes in shunt relation to ground to form the Tee network. The diodes are constructed as silicon chips and are mounted in very close relation with a substantially uniform conductive strip forming the series-circuit connection between the central diodes.

6 Claims, 4 Drawing Figures

VARIABLE MICROWAVE ATTENUATOR

This application is a continuation-in-part of copending application No. 78,891 filed Oct. 7, 1970, now U.S. Pat. No. 3,713,037 (which is a continuation-in-part of application Ser. No. 788,254, filed Dec. 31, 1968, now abandoned), having the same applicant and assignee as the present application, and describing forms of such attenuators and coupling devices.

BACKGROUND OF THE INVENTION

This invention relates to wideband microwave attenuators and particularly to a wideband voltage controlled microwave attenuator employing semiconductor elements such as PIN diodes, and to coupling devices usable in such attenuators.

A circuit designer synthesizing low frequency circuits may employ devices designated resistor, capacitor, inductor without questioning these designations. As a circuit's operating range is extended into the megahertz region and into gigahertz, complex impedance characteristics of these elements become significant and must be considered. When a circuit is designed in the microwave region each circuit elements must be considered as a complex network. The task of constructing the circuit which can equivalently be represented by a resistance that remains substantially constant in value over a wide band of frequencies in the microwave region becomes a sophisticated problem.

Diodes have been arranged in mesh configurations as variable attenuators with d-c (direct current) bias applied to the diodes to vary their dynamic impedance for adjusting the attenuation levels. When such mesh circuits are operated at low frequencies, or even into the lower end of the microwave region, various reactive effects are minor and a two-port symmetrical attenuator can be operated with a characteristic impedance which is generally constant and equal to that of the transmission system. However, at higher microwave frequencies, phase changes along connecting lines become significantly large, as do reactive effects of the diodes. As the frequency becomes higher (e.g., to gigahertz), compensation for these phase-distorting effects becomes more important. One approach for such compensation involves the use of small dimensions for various parts and connecting lines. However, such small dimensions, in turn, lead to other construction problems. A discussion of these problems, as well as solutions thereof, is set forth in the paper, "The T-Pi Configuration in the Design of Extremely Broadband PIN Attenuators" by Hopfer et al., 1968 Proc. NEC 308-313, which is incorporated herein by reference.

D-C blocking capacitors may be interspersed between the mesh diodes to isolate the effect of bias currents being applied to one diode from affecting the other diodes. These blocking capacitors may be effective at lower frequencies, but at higher frequencies they do not behave as lumped capacitances and thus impair the operation of such circuits.

SUMMARY OF THE INVENTION

Therefore, it is an object of this invention to provide a wideband voltage-controlled microwave attenuator.

It is another object of this invention to provide a voltage-controlled microwave attenuator which has a substantially uniform characteristic over a wide frequency band.

Another object is to provide a wideband voltage-controlled attenuator in which bias currents are applied to diodes through elements having high impedance characteristics throughout a broad microwave spectrum.

In the aforementioned application Ser. No. 788,254, one form of the invention is described utilizing encapsulated PIN diodes having a diameter of the order of one-tenth of an inch. An object of the present form of the invention is to provide a miniaturized construction in which the diode elements have a diameter of the order of one to two-hundredths of an inch, or less.

In accordance with one form of the invention described hereinafter, a wideband attenuator is constructed using four diode chips, two of which are effectively connected in series and two in shunt to provide a Tee network. By supplying direct bias currents to the diodes, the effective series and shunt resistances may be varied to produce variable attenuation. The four diodes are arranged in a layer sandwiched between conductive electrodes on opposite faces. One such electrode is arranged along one face of the diodes corresponding to the same electrode thereof. Separate electrodes (e.g., round wires or ribbons) are connected to the opposite faces of the outer diodes, and a common ground-plane electrode is connected to the opposite faces of the inner diodes. This diode assembly is constructed as a strip transmission line in which the PIN diodes are part of the transmission line. The assembly is mounted in a suitable housing with the separate electrodes of the outer diodes respectively connected to input and output connectors. The electrode connection between the inner diodes is a substantially uniform strip which is lossless at low operating frequencies, and at high operating frequencies, in the gigahertz range, it maintains the characteristic impedance of the line. Thereby, the operating frequencies of the attenuator tend to be extended to provide a substantially uniform characteristic over a wide frequency band.

BRIEF DESCRIPTION OF THE DRAWING

The foregoing and other objects of this invention, the various features thereof, as well as the invention itself, may be more fully understood from the following description when read together with the accompanying drawing, in which.

In the drawing, corresponding parts are referenced by similar numerals throughout.

DESCRIPTION OF A PREFERRED EMBODIMENT

Figure 1:
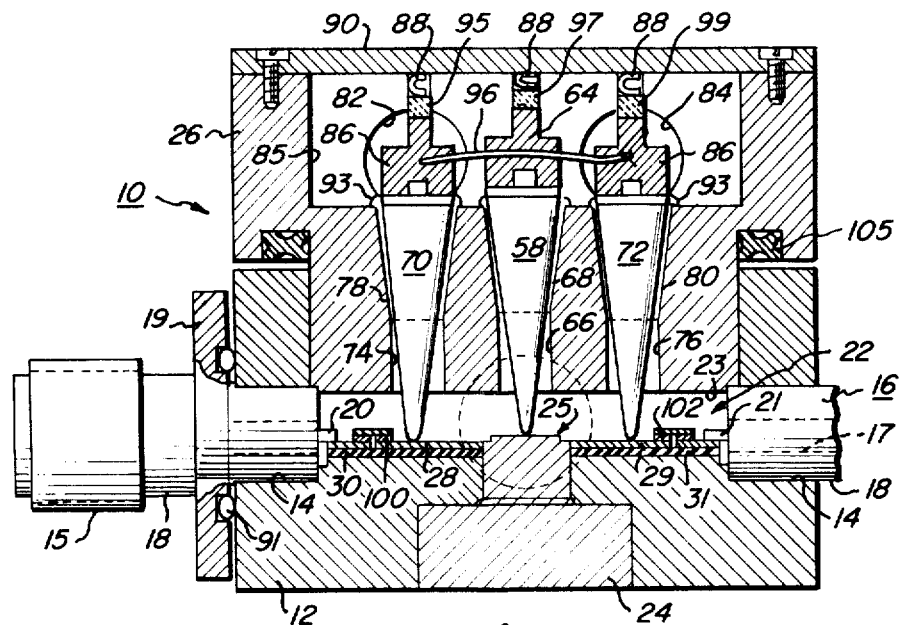
FIG. 1 is a sectional view in elevation of an attenuator unit embodying this invention.

In FIg. 1, the attenuator unit 10 is constructed with a housing of electrically conductive material such as aluminum. The housing is generally rectangular and symmetrical and includes a bottom block 12 of generally rectangular outer shape and having aligned circular openings 14 in opposite faces, in which are mounted coaxial connectors 15 and 16 having an outer conductor 18 and a central conductor 17 (part of the connector 16 is omitted from FIg. 1 for simplicity of illustration). A mounting plate 19 secured to the connector 15 is used to fasten the latter to the block.

The block 12 has a generally rectangular inner opening 22 formed between the inner and outer openings 14, and which is enclosed from the top by the lower face of a block 26 inserted within block 12. A stud 24 of generally circular form is inserted through a similarly shaped opening in the lower wall of block 12 and is centrally and symmetrically located between the ports 15 and 16. The stud carries on its upper face, which enters the opening 22, a diode network 25 illustrated in greatly enlarged form in FIGS. 2 and 3. The stud 24 serves as part of a ground plane for this network, and is preferably formed of a conductive material such as tellurium copper, which has a gold plating 27 (FIG. 2) for good electrical connections; a nickel plating under the gold serves as a barrier against diffusion of the gold into the copper and also is a good thermal conductor to carry heat energy away from the diode network.

The portions 20 and 21 of the central conductors projecting into the region 22 serve as a transition between the coaxial waveguide of the connectors 15 and 16 at each port and the strip-line form of TEM transmission line located within the opening 22. The strip-line has a ground plane formed by the upper surface of the aluminum block 12 which is in direct electrical contact with the outer coaxial conductor 18, which in use is normally a reference or ground connection. The strip-line at one port includes a dielectric layer 30, such as Teflon, in the form of a rectangular strip between the ground-plane block 12 and a thin, rectangular, copper strip 28 which overlies the dielectric and is directly connected to the central conductor 20 of one port. A similar copper strip 29 overlies a similar dielectric layer 31 at the other port thereof and is connected to the center conductor 21 of the other port's connector 16.

The center stud 24 is cut away at its upper end (FIG. 2) to form a smaller, circular throat portion 34 with a chamfered rim 48, and on the surrounding shoulder 36 a dielectric ring 38, such as beryllia, is mounted. The elements are dimensioned so that the top surface of the ring 38 is at the same level as the top surface of the copper strips 28 and 29; and radially extending over, and in direct contact with, the latter strips and the beryllia ring on each side are gold strip-line ribbons 40 and 41.

The top of the throat portion 34 of the center stud 24 is at substantially the same level as the top surface of the strip-line ribbons 40 and 41. Two outer diodes 42 and 43 respectively rest on the ribbons 40 and 41, and two inner diodes 44 and 45 rest on the upper throat portion 34 of stud 24. A dielectric block 46, such as Kapton, is located between the center diodes 44 and 45 and likewise rests on the throat 34 at the center thereof. The tops (e.g., the anodes) of all of the diodes 42–45 and of the center block 46 are at substantially the same level, and secured to these electrodes is a gold strip-line ribbon 50 which is generally uniform in thickness and in transverse width, for its electrical characteristics; a central portion 52 (FIG. 3) of this ribbon is somewhat wider for its mechanical, structural function as a bearing surface, as hereinafter described, but without effect on its electrical characteristics. The chamfered outer rim 48 of the top section of the throat 34 provides a substantial electrical spacing between the inner ends of strips 40 and 41 and the top conductive surface 27 of stud 24.

Resting on the center of strip 52 is the circular tip 54 of a metallic cone 56 which functions as a contact and which is secured to a cone 58 of dielectric material (such as rexolite) as the lower tip thereof. Formed around the conical surface of cone 58 is a helical groove 60, and inserted fully therein is a resistive wire (e.g., nickel) 62, which wire at its lower end is secured to the metal contact 56, and at its upper end is attached to a generally cylindrical metal contact 64 (FIG. 1) which sits on top of the dielectric cone 58. The conical metal tip 56 is employed for the extremely small contact radius of about 0.01 inch or less; alternatively, the dielectric cone 58 may be formed with a conical tip having a metallic contact coating connected to the spiral wire 62.

The upper block 26 of the housing has a cylindrical central hole 66 through which the lower portion of cone 58 passes. The passage 66 communicates with a counterbore opening 68 which generally mates with the outer surface of the cone 58 and supports the upper portion thereof. Thus the cone 58 is retained within the parallel conical opening 68 through a good portion of its length, and the cylindrical passage 66 provides a gradual transition in spacing between the wire 62 and grounded block 26.

Figure 4:
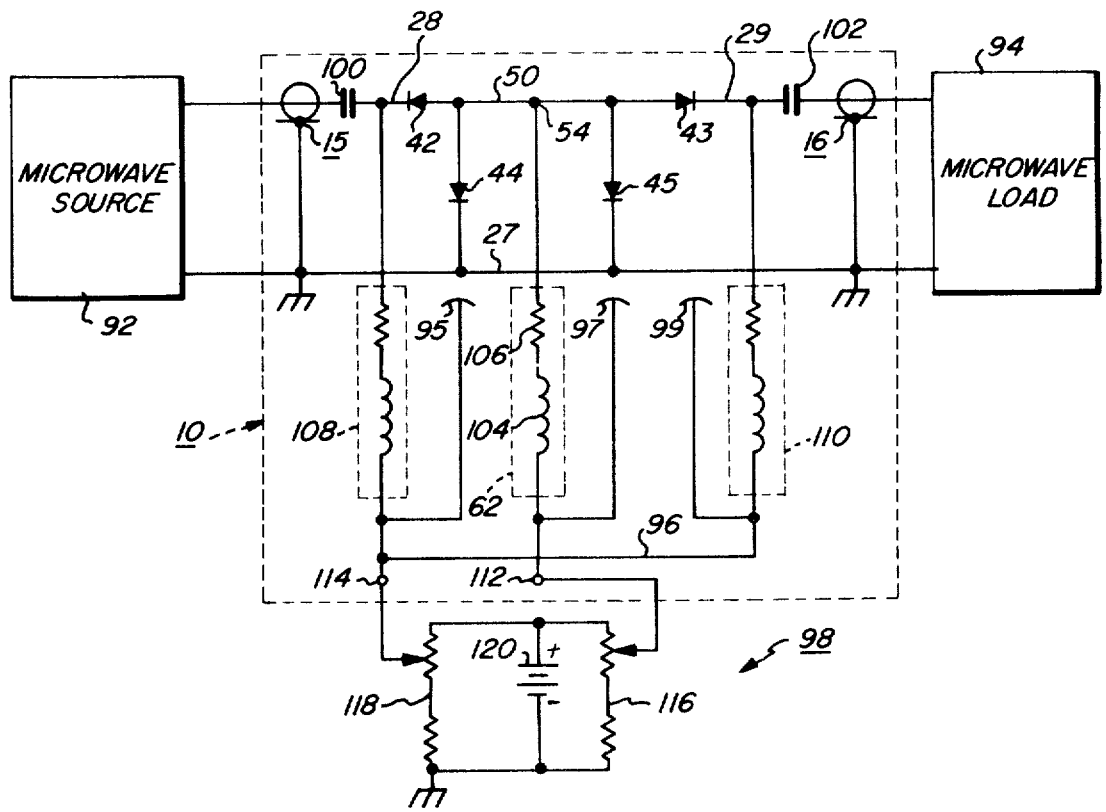
FIg. 4 is an equivalent schematic circuit diagram of the attenuator unit of FIG. 1.

The other cones 70 and 72 (FIG. 1) are constructed and wound with wires similarly to cone 58. Cones 70 and 72 are located in cylindrical openings 74 and 76 on opposite sides of the central opening 66 and aligned in a straight line therewith. Similar conical counterbore openings 78 and 80 respectively connect with the upper portions of the cylindrical openings 74 and 76. The counterbore openings 78 and 80 are similar, but have somewhat greater depth than the central counterbore opening 68 so that the cones 70 and 72 extend deeper (e.g., about 0.005 inch) into the central opening 22 and the metal contact tips thereof rest on the copper strip-line portions 28 and 29, which are at a lower level than strip 50, corresponding to about the thickness of the diodes 42–45, as may be seen in FIG. 2. Two transverse openings 82 and 84 in the upper block 28 pass into an upper rectangular opening 85 in block 26 into which the upper portions of the cones extend. The openings 82, 84 provide passage for two connectors (not shown) that are connected to the wires of the cones; one such connector (having a terminal 112 as indicated in the equivalent circuit of FIG. 4) is connected to the contact 64 of the central cone, and the other connector (terminal 114) is connected to one of the similar contacts 86 on the top of the other cones 70 and 72. A bypass capacitor 95, 97, 99 is respectively connected between the upper end of the spirals on each of the cones 70, 58 and 72 and the ground plane of the aluminum housing. Ceramic capacitors are used, and each is secured on the top of the metal contacts 64 and 86 and electrically connected in position by means of metallic C-springs 88 pressed between the respective capacitor and the cover plate 90. A wire 96 interconnects the contacts 86 of the outer cones; other wires connect one of the latter contacts and the central contact to the terminals 114 and 112, respectively (FIG. 4). Each of the cones 58, 70 and 72 is fastened to and sealed in the upper block 26 by means of a flexible epoxy or silicone rubber in the form of a separate ring 93 adjacent the upper rim of each of these cones. The resilience in this adhesive 93 is such that when the block 26 is inserted in the block 12, and the lower tips of the cones engage the respective contact points on ribbon 50 and ribbons 28 and 29, the adhesive permits a slight upward movement of the cones caused by the pressure of engagement at the contact points. The dimensions are so chosen that such movement of the cones results in sufficient pressure being achieved in the mounting of the cones, and the resiliency of the adhesive 93 ensures that good electrical contact at the lower tips 56 is achieved. The center passage 22 of the housing is additionally sealed, when the unit is assembled, by means of resilient O-rings 91 at the mounting plates 19 and a quad-ring 105 between the upper and lower blocks 26 and 12.

Each PIN diode 42–45 is a semiconductor element having a double-diffused junction consisting of P and N regions separated by a thin layer of undoped or intrinsic (I) semiconductors; the intrinsic layer may be sharply defined if fabricated epitaxially, or it may be ill-defined due to diffusion. In its forward-biased state, the PIN diode, it is known, behaves as a resistive element over a wide range of the microwave spectrum. The dynamic resistance between its two electrodes is controllable by a bias current (which may be d-c or at audio or video frequencies) to change, for example, from about 10,000 ohms to 1 or 2 ohms. The dynamic resistance is substantially independent of frequency so long as the period of the signal is short relative to the lifetime of the minority carriers in the semiconductor.

There are no sharp upper or lower frequency limits in the microwave region beyond which the PIN diode ceases to function as a controllable resistive element, and they have been used to 18 gigahertz and above. PIN diodes have associated parasitic reactances which produce deviations from their resistive nature at the high frequency end of the microwave spectrum.

The chips are fabricated with a gold terminal at the top (which may be the anode or cathode and which illustratively is the anode) surface and with a thin layer of gold solder at the bottom surface, whereby good electrical connections are formed (e.g., by welding or thermocompression bonding) with the gold conductors 27, 40, 41, 50 in the strip-line construction. The square diode chips typically are about 0.015 to 0.020 inch long on a side and about 0.005 inch thick. The PIN diode chips 42–45 are illustrated (FIG. 2) with their upper corners etched away, which construction serves to reduce the capacitance between the diode electrodes.

Figure 2:
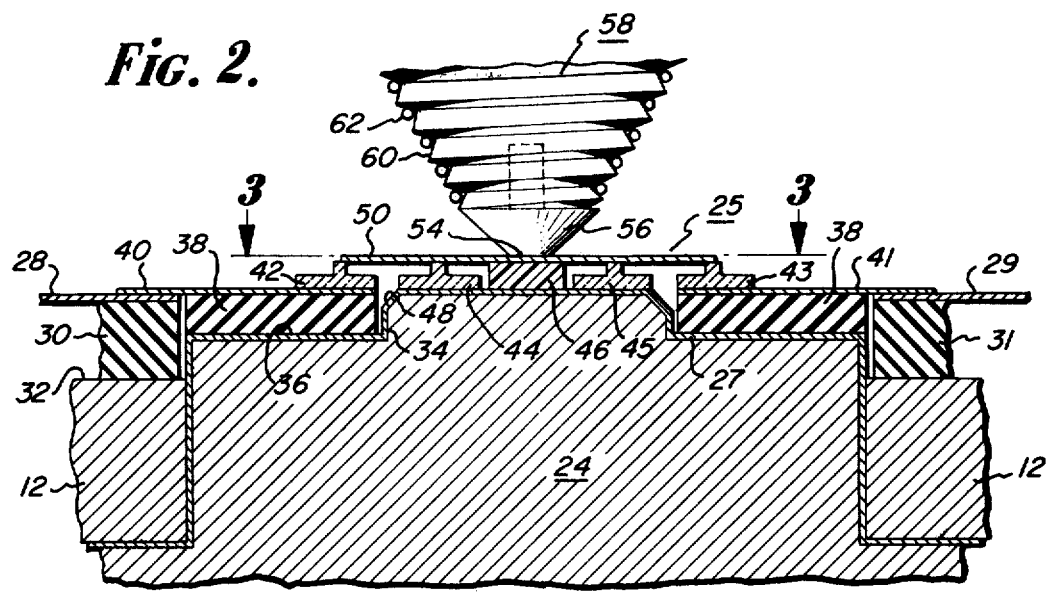
FIg. 2 is a greatly enlarged view of the encircled portion of FIG. 1 and is a sectional view corresponding thereto.
Figure 3:
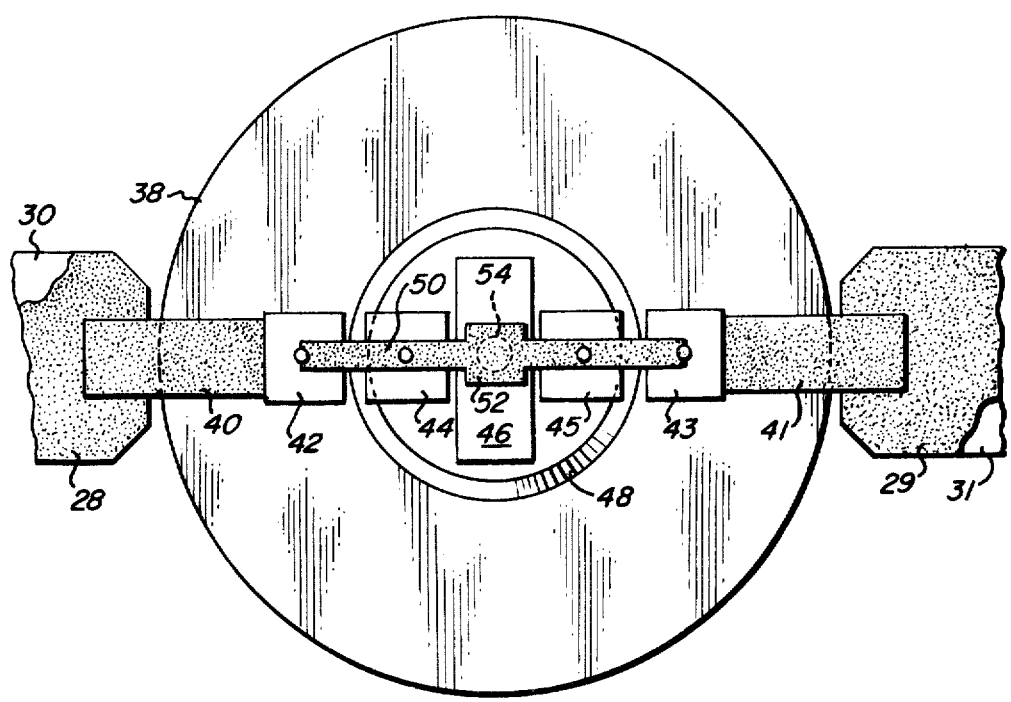
FIG. 3 is a top plan view taken along the line 3—3 of FIg. 2.

The schematic circuit diagram of FIG. 4 illustrates in the broken-line box 10 an equivalent circuit diagram of the attenuator unit of FIGS. 1–3, and shows the connection of the unit 10 to an appropriate source 92 of microwave signals (e.g., in the broad band of 0.1 to 18 GHz) via the input port 15, and to a microwave load 94 via the output port 16. Biasing is supplied to the unit 10 by means of circuits 98. Blocking capacitors 100 and 102 are provided in the input and output sections of the unit by any appropriate means; for example, a dielectric element (a chip of barium titanate) may be inserted in a break in the strips 28 and 29 as shown in FIG. 1 (or inserted in a break in the central conductor of the connectors 15 and 16 in a manner known in the art). For example, as indicated in FIG. 1, it has been found suitable to form a break of about 0.003 inch in each strip 28 and 29 and on top of these strips 28 and 29 a dielectric chip 100 and 102 is set and an overlay 103, 105 of gold ribbon is used to bridge the breaks.

the equivalent circuit may be traced from the central conductor 20 of the input port 15 via capacitor 100 and the conductive strips 28 and 40 to the cathode of series diode 42, the anode of which is in electrical contact with the ribbon strip 50, as are the anodes of the other diodes 43–45. The cathode of diode 43 is connected via the conductive strips 41 and 29 and capacitor 102 to central conductor 20 of port 16. The cathodes of shunt diodes 44 and 45 are connected to the ground plane of gold plating 27 at the top surface of the stud throat 34. The wire 62 of the central cone 58 has a direct electrical connection to the center of the gold ribbon 50, and electrically it has a substantial inductance 104 produced by the multi-turn conical format, and a substantial resistance 106 due to the use of a resistive nickel wire, as explained below. The wires 108 and 110 (FIG. 4) encircling the cones 70 and 72 are similarly characterized by a substantial inductance and resistance. The wires 108, 62 and 110 are coupled by the ceramic capacitors 95, 97 and 99, respectively, which serve to bypass the r-f to ground.

Terminal connectors 112 and 114 (inserted via openings 82 and 84 in the upper block 26) are respectively connected to potentiometers 116 and 118, which are energized by battery 120. Thereby, a biasing current supplied to the node 54 between the shunt diodes 44 and 45 may be varied separately from the direct current bias supplied to the cathodes of the series diodes 42 and 43.

The operation may be summarized as follows: The variation of the bias supplied across each of the diodes effectively modifies the operating characteristic of the diode to a different portion of the nonlinear resistive characteristic thereof. With the resistances of the series and shunt diodes varied, the overall attenuation of the unit 10 is varied. For example, with an extremely large resistance in series diodes 42 and 43 and a relatively small resistance in shunt diodes 44 and 45, the unit has an overall high attenuation. Similarly, when the resistance of the shunt diodes is extremely large, and that of the series diodes small, the overall attenuation is small. Between those two extremes of attenuation, variations in attenuation may be achieved by intermediate levels of bias current. The unit may be operated between the two extreme levels of attenuation in the manner of an on-off switch; or, alternatively, it may be operated at various intermediate levels corresponding to variations in the bias current supplied to the diodes. However, an additional constraint is that the impedance of the transmission line must be maintained at the characteristic impedance (see, e.g., the book "Reference Data, ITT Handbook," 4th. ed., p. 255, Symmetrical T and H Attenuators).

A microwave signal from the source 92 is applied to the input connector 15, which applies the signal via capacitor 100 to the cathode of the series diode 42. Part of the signal is dropped across the series diode 42, depending on its effective impedance, resulting in an attenuated signal applied across the shunt diodes 44 and 45. The amplitude of this microwave signal across the shunt diodes is determined by the ratio of the dynamic impedance of the series diode 42 and the dynamic impedance of the combination of the two shunt diodes 44 and 45 in parallel with each other and with the series combination of series diode 43 and the impedance of the load 94 that is connected to output connector 16. The attenuated microwave signal is further reduced in amplitude by the voltage dividing effect of the diode 43 in series with the terminating impedance of load 94. Thus the degree of attenuation provided by the attenuator circuit 10 is determined by the dynamic impedances of the diodes 42–45, and those impedances are determined in turn by the bias currents flowing therethrough in accordance with the known impedance characteristics of the diodes.

Bias currents are fed to the diodes 42–45 through the low-pass filter networks 104, 108 and 110 and directly to the conductors 50, 28 and 29, respectively. These low-pass filter networks 108, 104 and 110 are connected to the cathode of series diode 42, the center strip 52 of strip 50 at the junction of the anodes of diodes 42–45, and the cathode of series diode 43, respectively. Being connected to the microwave signal path, these low-pass filter networks are designed to exhibit a high impedance to the microwave signal so as not to load that signal, but yet exhibit a low impedance to the bias signals applied to the diodes. For example, if the microwave signal to be passed by the attenuator circuit 10 has components in the frequency band between 50 megahertz and 18 gigahertz (a bandwidth for which the unit 10 may be used), while the bias currents represent a video signal having a spectrum between d-c and 4 megahertz, the low-pass filter networks, 31, 32 and 33 would have low impedances from d-c to 4 megahertz, and high impedances from 50 megahertz to 18 gigahertz.

The bias circuit 98 is one form of circuit that may be used for applying the bias currents. The potentiometers 116 and 118 serve as low-impedance, constant voltage sources and they are varied to establish (with the fixed resistances 106 of the networks 62, 108 and 110) the series and shunt bias currents, which vary typically from about 0 to 100 milliamperes to vary the r-f resistances of the diodes continuously from about 1,000 to 5 ohms or less. Other adjustable current sources, including various voltage controlled current sources, may be employed in their place. With appropriate selections of bias currents, a wide range of continuously variable attenuations from substantially zero up to about 40, 60 or 90 db may be attained with a single unit for different modes of operation. These modes include bilaterally matched, unilaterally matched and unmatched, with lower attenuations being achieved for higher degrees of matching. In addition, the circuit may be rapidly switched between any two fixed values of attenuation in a fraction of a millisecond by means of voltage-controlled (e.g., transistor-controlled) sources of bias current. The circuit may also be operated as a switch between extreme attenuation levels.

The shunt diodes 44 and 45 are formed as part of the strip transmission line. That is, the dimensions of the gold ribbon 50 and the width and thickness of the semiconductor chips 44 and 45 are chosen so that an average characteristic impedance is achieved over the length of the line. For example, the dielectric constant of silicon (the principal material of the semiconductor) is 14, and the overall dimensions and spacing of the diodes are so chosen that an appropriate effective dielectric constant (e.g., about 10) is achieved, to provide a transmission line having the desired (e.g., 50-ohm) characteristic impedance.

In one embodiment, the ribbon strip 50 is dimensioned to have a width of about 0.006 inch in the regions overlapping the diodes, which have a width of 0.015 to 0.020 inch. The strip 50 is slightly widened at its central portion 46 overlying the dielectric block 48 to provide a larger area for effective contact with the tip 54 of the contact 56. The dielectric of bearing block 48 (for example, by use of Kapton for its material) is chosen to maintain the 50-ohm characteristic impedance in that region; its dimensions (somewhat enlarged, as shown) are chosen to maintain that characteristic impedance in the center of the strip line. Thus, by proper choice of dimensions, the diode chips 44 and 45 become part of the transmission line itself, which tends to compensate for the shunt capacitance across these diodes. Thereby, the characteristic impedance of the transmission line is preserved by the choice of dimensions and dielectric materials, and by the effects of the various parts thereof which in combined effect approximate the average of the various parts. In general, the dimensions chosen are small with respect to wavelength at high operating frequencies. However, the ribbon 50 between the shunt diodes 44 and 45 may be somewhat extra long for reasons discussed in the above cited Hopfer paper and particularly in accordance with the criterion of Equation 13 thereof. At low operating frequencies, the diodes 44 and 45 are effectively in parallel and serve as a single resistive impedance. At high frequencies the network of ribbon 50 and diodes 44 and 45 maintains the characteristic impedance of the line, so that the unit operates overall as a 50-ohm effective line for operation in a matched condition. Where the performance at zero insertion loss indicates excess shunt capacitance due to the shunt diodes, the line section interconnecting those diodes may be designed to have somewhat greater impedance to compensate; alternatively, the interconnecting line section may simply be a 50-ohm line.

The series diodes 42 and 43 do not introduce a large bypass capacitance relative to the 50-ohm characteristic impedance of the transmission line and of the overall unit 10; the series diodes are assembled in the strip-line structure to avoid the introduction of undesirable capacitance. The diodes 42–45 are assembled in a flat layer between the plane of the ribbon strip 50 and that of the strips 40 and 41 and ground-plane plating 27. Thus, a flat structure is provided in which the conductive strips that form the transmission line are maintained in corresponding planes. There are no significant bends in the signal plane; the out-of-plane variations occur in the ground plane of stud 24 and block 12. This construction avoids any leakage capacitances which would result from bends in the strip 50 which connects the diodes or in the other strips and which would lead to bypassing of signals such as to prevent the desired uniform response over the bandwidth.

The use of particular materials and the flat structure of the strip line is effective for thermal dissipation of the energy dissipated within the attenuating diodes. The beryllia used for the dielectric ring 38 has a low thermal resistance and is effective to carry away heat generated in the series diodes 42 and 43. The nickel plating over the copper stud 24 and underlying the gold plating 27 is effective by reason of its low thermal resistance for carrying away heat generated in the shunt diodes and that transmitted by the beryllia ring 38. The heat received by the stud 24 is transmitted to the aluminum housing block 12, which is effective both as a sink and as a transmitter of heat. Thereby, overheating of the resistive diodes 42–45 due to the heat generated with the attenuation of the electrical energy is avoided.

In general, the dimensions are chosen to provide extremely small lead lengths so as to minimize the resulting inductive effects of electrical connections at the very high frequencies (e.g., up to 18 gigahertz). The planar strip-line construction is effective to reduce the conductor lengths associated with the shunt diodes 44 and 45 to generally negligible amounts. This construction avoids substantial shunt inductances at high frequencies which would otherwise tend to limit a high attenuation that might be achieved. Moreover, the structuring of the unit so that its elements are generally enclosed within the strip transmission line tends to maintain a uniform characteristic impedance over the broad frequency range.

Various modifications of this invention are described in the aforementioned copending application Ser. No. 078,891. Other modifications of the invention will be apparent from the above description and the illustrated embodiments. For example, in place of the strip line ribbons 40, 41 and 50, other shapes of conductors may be employed. These conductors 40, 41 and 50 may be round wires which require an appropriate design and adjustment of the dimensions of the unit consistent with appropriate impedance values to maintain the transmission line characteristics. In one form of the invention using ribbons, thicknesses of the order of ½ or ¼ mil are used for bonding to a small contact on the faces of the diodes. Where a round wire or wires are used instead of one or more of the ribbons 40, 41 and 50, a fine wire (e.g., of the order of 1 mil diameter) may be required to assure bondability in the small dimensions that are preferred.

Thus, a new and improved variable microwave attenuator, using PIN diodes connected in series and shunt relation, is provided by this invention, and which can be fabricated in extremely small size to achieve a wideband operation. Extremely small chips (or a solid block) of PIN diodes are used and assembled in a microstrip transmission line structure which is compact, suitable for manufacture, and effective in operation. The microstrip is constructed to have the same characteristic impedance as the remainder of the unit (e.g., as the input and output connectors) to be matched with that of a microwave source and load, whereby wideband performance is achieved. The diode chips may have extremely small dimensions (e.g., 0.02 inch or less) and a Tee-Pi configuration may be employed in which two shunt diodes are connected by a conductor of a length about an eighth or a quarter wavelength at the highest microwave operating frequencies. The overall unit is designed to operate over a wide band of microwave operating frequencies including multi-gigahertz, and a generally flat response characteristic is achieved over that band.

What is claimed is:

1. A microwave device comprising:
   microwave input and output means;
   a first conductive element;
   second, third and fourth conductive elements spacedly mounted from each other and from said first conductive element and generally parallel to said first conductive element;
   semiconductor means mounted between opposing surfaces of said first conductive element and the others of said conductive elements and forming three separate conductive paths between said first element and each of said other elements;
   and means for selectively applying bias signals to said conductive elements and for connecting said conductive elements in a network with two of said conductive paths associated with said second and fourth elements in series relation with said input and output means and the third of said paths associated with said third element in shunt with said input and output means.

2. A microwave device as recited in claim 1 wherein said microwave input and output means have separate signal and ground conductors, said third element being coupled to the ground conductor of said input and output means, and said second and fourth elements being respectively coupled to the signal conductor of said input and output means whereby the conductive path between said first and third elements is in shunt relation to others of said conductive paths.

3. A microwave device as recited in claim 2 wherein said second, third and fourth elements are mounted substantially in a common plane.

4. A microwave device as recited in claim 2 wherein said second, third and fourth elements are round wires.

5. A microwave device as recited in claim 2 wherein said semiconductor means includes PIN diode material, said first and third elements form a TEM strip transmission line with the PIN diode material as dielectric therebetween, and with a characteristic impedance substantially the same as that of said input and output means, whereby said device is operable as an attenuator with the biasing of said PIN diode material by said bias signals.

6. A microwave device as recited in claim 5 wherein a ground plane is connected to said third element and the ground conductor of said input and output means; said second and fourth elements are spaced from said ground plane by a dielectric material having good thermal conductivity, whereby heat energy in said PIN diode material between said first and second and fourth elements is effectively dissipated to said ground plane element.

* * * * *